United States Patent
Chacinski et al.

(10) Patent No.: US 9,882,080 B2
(45) Date of Patent: Jan. 30, 2018

(54) HIGH SPEED PHOTODETECTOR

(71) Applicant: Tyco Electronics Svenksa Holdings AB, Jarfalla (SE)

(72) Inventors: Marek Grzegorz Chacinski, Farsta (SE); Nicolae Pantazi Chitica, Kista (SE)

(73) Assignee: Mellanox Technologies Ltd., Yokneam (IL)

( * ) Notice: Subject to any disclaimer, the term of this patent is extended or adjusted under 35 U.S.C. 154(b) by 0 days.

(21) Appl. No.: 14/943,723

(22) Filed: Nov. 17, 2015

(65) Prior Publication Data

US 2016/0172523 A1 Jun. 16, 2016

Related U.S. Application Data

(63) Continuation of application No. PCT/EP2014/060432, filed on May 21, 2014.

(30) Foreign Application Priority Data

May 31, 2013 (EP) .................................... 13002838

(51) Int. Cl.
*H01L 31/10* (2006.01)
*H01L 31/0304* (2006.01)
*H01L 31/105* (2006.01)

(52) U.S. Cl.
CPC ...... *H01L 31/105* (2013.01); *H01L 31/03042* (2013.01); *H01L 31/03046* (2013.01)

(58) Field of Classification Search
CPC ..... H01L 31/14; H01L 31/105; H01L 31/109; H01L 31/14643; H01L 31/03; H01L 31/03; H01L 31/0304; H01L 31/03042; H01L 31/03046; H01L 31/10

USPC ........................................................ 257/184

See application file for complete search history.

(56) References Cited

U.S. PATENT DOCUMENTS

| | | | |
|---|---|---|---|
| 5,243,198 A * | 9/1993 | Syme | G01R 21/10 257/17 |
| 5,576,559 A | 11/1996 | Davis | |
| 5,818,096 A | 10/1998 | Ishibashi et al. | |

(Continued)

FOREIGN PATENT DOCUMENTS

| | | |
|---|---|---|
| JP | 2003174185 A | 6/2003 |
| JP | 2011176094 A | 9/2011 |

(Continued)

OTHER PUBLICATIONS

Abstract of WO9613864(A1), dated May 9, 1996, 2 pages.
Abstract of JP2011176094(A), dated Sep. 8, 2011, 2 pages.
Abstract of JP2003174185(A), dated Jun. 20, 2003, 1 page.
PCT International Search Report, International Application No. PCT/EP2014/060432, dated Jun. 18, 2014, 5 pages.
Chinese Office Action and English translation, dated Aug. 3, 2016, 20 pages.

(Continued)

*Primary Examiner* — Monica D Harrison
(74) *Attorney, Agent, or Firm* — Barley Snyder

(57) ABSTRACT

A photodetector is disclosed. A first layer of the photodetector has a first semiconductor material having a first band gap energy, a first electric field, and a first doping concentration. A second layer has a second semiconductor material having a second band gap energy higher than the first band gap energy, a non-zero second electric field smaller than the first electric field, and a second doping concentration. The second layer is interfaced with the first layer. A region between the first and second layers has a third doping concentration.

29 Claims, 2 Drawing Sheets

(56) References Cited

U.S. PATENT DOCUMENTS

| | | | |
|---|---|---|---|
| 8,044,296 B2* | 10/2011 | Yamazaki | H01L 31/0392 |
| | | | 136/244 |
| 8,415,231 B2 | 4/2013 | Yamazaki | |
| 8,895,839 B2* | 11/2014 | Mazur | H01L 31/0725 |
| | | | 136/255 |
| 2004/0056250 A1 | 3/2004 | Wang et al. | |
| 2007/0096240 A1 | 5/2007 | Yao | |
| 2011/0100441 A1 | 5/2011 | Mazur et al. | |

FOREIGN PATENT DOCUMENTS

| | | |
|---|---|---|
| TW | 200903819 A | 1/2009 |
| WO | 9613864 A1 | 5/1996 |
| WO | 03065416 A2 | 8/2003 |

OTHER PUBLICATIONS

Intellectual Property Office of Singapore Written Opinion, dated May 12, 2017, 6 pages.
Chinese Rejection Decision, dated May 4, 2017, 7 pages.
English translation of Chinese Rejection Decision, dated May 4, 2017, 11 pages.
Chinese Rejection Decision and English translation, dated May 4, 2017, 18 pages.
Taiwanese Office Action and English translation, dated Oct. 23, 2017, 8 pages.
Abstract of TW200903819, dated Jan. 16, 2009, 2 pages.

\* cited by examiner

HIGH SPEED PHOTODETECTOR

CROSS-REFERENCE TO RELATED APPLICATIONS

This application is a continuation of PCT Application No. PCT/EP2014/060432, filed May 21, 2014, which claims priority under 35 U.S.C. §119 to European Patent No. 13002838.4, filed May 31, 2013.

FIELD OF THE INVENTION

The present invention relates to semiconductor-based photodetectors, and more particularly, to a structure and method of producing a high-speed photodetector with enhanced speed response.

BACKGROUND

Semiconductor-based photodetectors capable of converting an optical signal into a detectable electrical signal are widely used in diverse technical fields such as optical communication networks. Photodiodes based on a p-i-n junction, also called PIN photodiodes, are particularly suited as high speed photodetectors due to their rapid response to incident light in comparison to p-n junctions. Nonetheless, the bandwidth of conventional PIN photodetectors, i.e. the speed of response to incident light, is often limited by the much slower transit time within the intrinsic i-layer of hole carriers of an electron-holes pair in comparison to electron carriers.

A common way to increase bandwidth of the photodetector is to reduce the vertical length (i.e. height or thickness) of a light absorption layer so as to reduce the transit time of charge carriers. Since this leads directly to a larger specific capacitance, the area of the photodiode and by that the photodetecting area has to be reduced in order to keep the capacitance below a certain specified value. Consequently, at the same time, the responsivity of the photodiode decreases with a decrease in the thickness of the light absorption region. An approach for reducing the specific capacitance lies in introducing an intrinsic drift layer that does not absorb light in the wavelength range of interest. In a first approximation, the carriers generated in the light absorption layer travel to collecting layers and electrodes at drift velocities which are proportional to the electrical field and the respective carrier mobility. Generally, the carrier velocity increases with field until it saturates. However, the saturation velocity for electron carriers is typically attained at lower electric fields than for hole carriers. Hence, as in most of conventional systems the applied external electric field is limited, the hole carriers often do not reach their saturation velocity. One should notice that as holes travel slower than electrons, the illumination of photodiodes is often provided from the p-side, which results in a shorter effective distance for the holes to travel along. By designing the photodetector such that only the faster carriers (electrons) will have to travel over the additional drift layer, the drift layer will have only a minor contribution to overall transport times but will have a substantial effect on reducing the specific capacitance of the photodiode.

An approach for improving frequency response and saturation output of a PIN photodiode has been proposed in U.S. Pat. No. 5,818,096. This approach lies in separating the function of light absorption and carrier traveling between two semiconductor layers instead of using the same depleted, intrinsic semiconductor layer as in the conventional PIN photodiode. In particular, a p-type semiconductor layer is used as the light absorption layer and an intrinsic, non-absorbing semiconductor layer is used as carrier transport layer. In this configuration, the response time of the carrier injection into the carrier traveling layer is essentially determined by the diffusion time of the electrons in the p-type light absorption layer. Since the response time of hole carriers in the light absorption layer is extremely short, as they only respond to in relation to movement of the electrons within this layer, the slower drift velocity of the hole carriers in the carrier transport layer does not directly contribute to the photodiode response. This results in improved frequency response and saturation output. However, the increase in saturation power implies a lower responsivity of the photodiode.

Published patent application US 2007/0096240 A1 proposes a photodiode structure for enhancing responsivity at the cost of lower-saturation power. The proposed photodiode structure includes, in addition to the common intrinsic, light absorption layer, a p-doped layer and/or an n-doped layer as additional light absorbing layers. In this case, the movement of minority carriers (i.e. the carriers of polarity opposite to doping carriers) within the doped (undepleted) absorption layers is essentially determined by their respective diffusion time. The minority carriers may then rapidly diffuse from the doped absorption layers into the intrinsic layer and, therefore, do not significantly affect the total transit time in comparison with a conventional PIN photodiode. As the additional doped absorption layers increase the overall optical absorption volume, the photodiode responsivity is also increased.

Patent application WO 03/065416 describes a modified PIN photodiode for increasing responsivity of the device without substantially reducing bandwidth. The proposed photodiode has a p-type semiconductor layer and an n-type semiconductor layer coupled by a second p-type semiconductor layer, which acts as the light absorption layer. The second p-type semiconductor layer has a graded p-doping concentration along the path of the carriers, which varies from a high value near the anode to lower values towards the cathode. The graded p-doping concentration increases the net absorption of the photodiode without substantially reducing the transit time of the carriers within the absorption layer. Such graded doping increases capacitance relative to an intrinsic semiconductor of the same thickness, although the pseudo electric field that is created by the graded doping may give the electrons a higher velocity that compensates for the increased capacitance.

SUMMARY

An object of the invention, among others, is to provide a high speed photodetector capable of providing enhanced response time while maintaining a desirable balance between responsivity and capacitance of the photodetector. A first layer of the disclosed photodetector has a first semiconductor material having a first band gap energy, a first electric field, and a first doping concentration. A second layer has a second semiconductor material having a second band gap energy higher than the first band gap energy, a non-zero second electric field smaller than the first electric field, and a second doping concentration. The second layer is interfaced with the first layer. A region between the first and second layers has a third doping concentration.

BRIEF DESCRIPTION OF THE DRAWINGS

The invention will now be described by way of example with reference to the accompanying figures, of which.

DETAILED DESCRIPTION OF THE EMBODIMENTS

The invention is explained in greater detail below with reference to embodiments of a photodetector. This invention may, however, be embodied in many different forms and should not be construed as limited to the embodiments set forth herein; rather, these embodiments are provided so that this disclosure will be thorough and complete and still fully convey the scope of the invention to those skilled in the art.

As described hereinafter, the term "intrinsic semiconductor" is to be understood within its ordinary meaning in the art, which is, pure, undoped and may also include lightly doped semiconductors that are non-intentionally doped. The term "doped" will be used for referring to n-type or p-type doped semiconductors having a doping concentration that is higher than the doping concentration of intrinsic semiconductors described thereafter.

Figure 1:
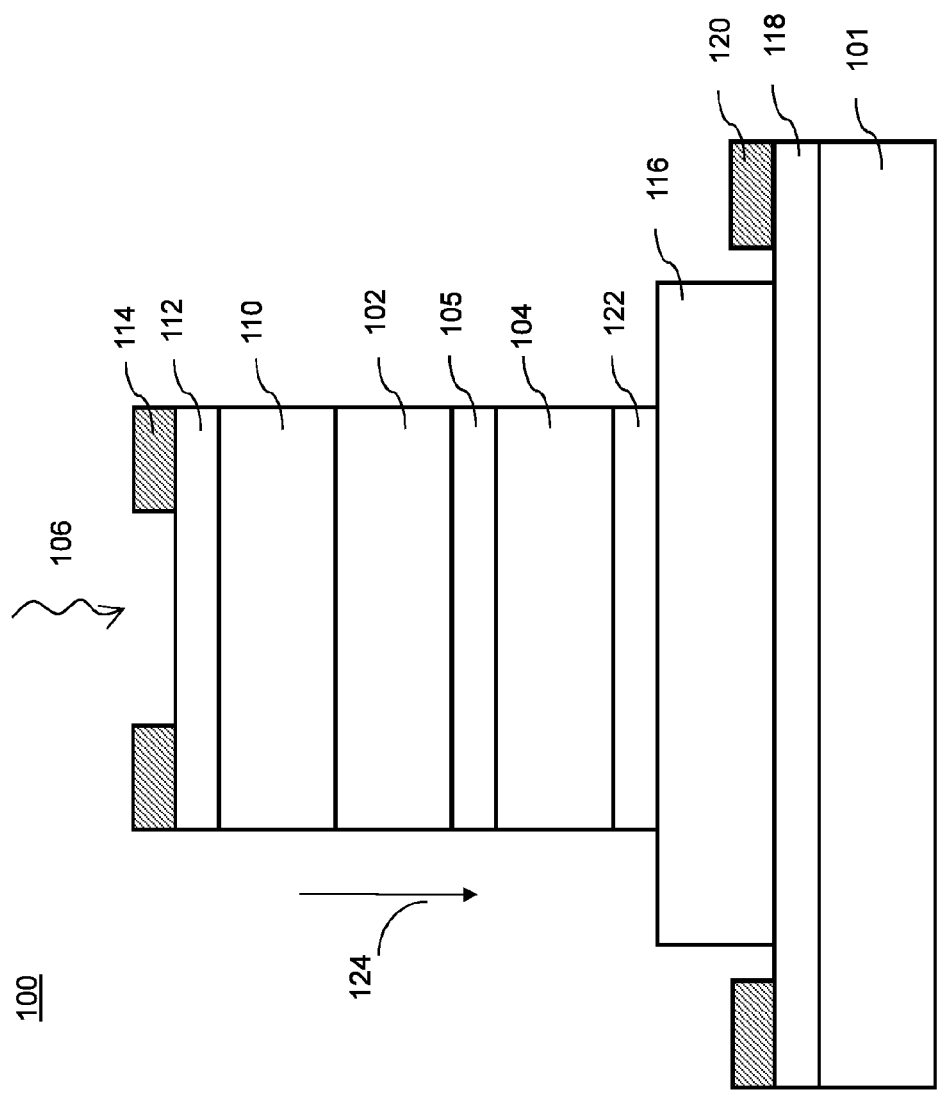
FIG. 1 is a sectional view of a photodetector according to the invention.

FIG. 1 illustrates a cross sectional view of a photodetector 100 according to an embodiment of the present invention. The photodetector 100 includes a substrate 101, a first semiconductor layer 102, a second semiconductor layer 104, a third semiconductor layer 105, a fourth semiconductor layer 110, a first contact layer 112, a first ohmic contact 114, a fifth semiconductor layer 116, a second contact layer 118, a second ohmic contact 120, and a thin semiconductor barrier layer 122. The major components of the invention will now be described in greater detail.

In the illustrated embodiment, the photodetector 100 is vertically illuminated from a top side, which is the side of the photodetector 100 opposite to the substrate 101. However, other configurations may be envisaged in which the incident light illuminates the bottom side, i.e. the side of the photodetector substrate 101. Further, the terms "top" and "bottom" should be construed as relative terms used for the sole purpose of identifying opposite sides of the photodetector 100 and should not be construed as being limitative with regard to the physical orientation of the photodetector 100 when in use.

The photodetector 100 comprises a first semiconductor layer 102, which acts as a light absorption layer, and a second semiconductor layer 104 disposed at an adjacent side of the light absorption layer 102 opposite to the side of the incident light 106 and interfaced with the light absorption layer 102. The second semiconductor layer 104 serves as a carrier-travelling layer, also called drift layer, as it will be described later. The photodetector 100 further comprises a third semiconductor layer 105 disposed between the light absorption layer 102 and the drift layer 104 and which interfaces the adjacent sides of the light absorption layer 102 and drift layer 104. The third semiconductor layer 105 is a graded band gap energy layer, or simply grading layer, as it will be explained later.

On an adjacent side of the light absorption layer 102 opposite to side adjacent to the drift layer 104, the photodiode 100 further comprises a fourth semiconductor layer 110 made of a doped semiconductor material and which acts as a current spreading layer, as it will described later. A first contact layer 112 comprising a doped semiconductor material of the same type as the fourth semiconductor layer 110, in the illustrated embodiment a p-type semiconductor, is provided on the top of the current spreading layer 110 for improving electrical contact of the current spreading layer 110 with a first ohmic contact 114 that is deposited on the top of the photodetector structure. The first contact layer 112 may also serve as a capping layer.

The first ohmic contact 114 formed over the contact layer 112 may have the form of a ring so as not to cover completely the underlying semiconductor layers and allow vertically incident light 106 to illuminate directly the p-contact layer 112. With this design of the first ohmic contact 114, incident light 106 is directly transmitted to the underlying semiconductor layers without passing through the ohmic contact 114. In an alternative embodiment, the first ohmic contact 114 may be provided with other designs, such as a closed circular shape.

The photodetector 100 further comprises a fifth semiconductor layer 116 disposed on the side of the drift layer 104 opposite to the side adjacent to the light absorption layer 102. The fifth semiconductor layer 116 comprises a semiconductor material doped with impurities that provide carriers of polarity opposite to the fourth semiconductor layer 110 as it also functions as a current spreading layer at this side of the photodetector 100.

A second contact layer 118 comprising a semiconductor material of the same doping type as the fifth semiconductor layer 116 is provided between the fifth semiconductor layer 116 and the substrate 101. As shown in FIG. 1, the second contact layer 118 extends over the substrate 101 beyond the vertically stacked semiconductor layers formed above. The second contact layer 118 improves the electrical coupling between the current spreading layer 116 and a second ohmic contact 120 that is deposited over the second layer 118. Similarly to the first ohmic contact 114, the second ohmic contact 120 is provided with the design of a planar ring that is deposited over the second contact layer 118 and arranged concentrically around the vertically stacked structure of semiconductor layers. In other embodiments, the second ohmic contact 120 may adopt other designs and be provided, for e.g. as two parallel stripe electrodes deposited on the second contact layer 118 at each side of the vertically stacked structure.

The first ohmic contact 114 and the second ohmic contact 120 may be made of an electrically conducting material, such as aluminium, silver, gold or copper. In the present embodiment, the first and second ohmic contacts serve respectively as anode and cathode contacts for electrically connecting the photodiode 100 to an external circuit (not shown).

As described with reference to FIG. 1, the photodetector 100 is formed as a heterostructure of layers that are vertically stacked over the substrate 101. In the present embodiment, the substrate is made of a GaAs compound. However, other types of substrate may be used. Namely, the substrate may be of material suitable for providing a distributed Bragg reflector (DBR) such as an AlGaAs compound. In other embodiments, the second contact layer 118 itself may serve as substrate of the photodetector structure.

Further details of the layers forming the photodetector 100 will now be described with reference to FIG. 2, which shows a band diagram 200 for the photodetector 100 illustrated in FIG. 1.

The band diagram 200 schematically illustrates a variation of a conduction band edge 202 and a valence band edge 204 along the thickness of the photodetector layers in the vertical direction 124 shown in FIG. 1. The band gap energy for each layer is depicted as the separation between the conduction band edge 202 and the valence band edge 204 of each layer in the vertical direction of the band diagram 200. The horizontal direction in the band diagram 200 represents a conduction path of carriers between the anode 114 and the cathode 120 of the photodetector 100 shown in FIG. 1.

A principle underlying the structure of the photodetector 100 lies in using a thin light absorbing layer, where the applied field is high, combined with a drift layer specified with high mobility at significantly lower field with trimmed doping profile.

The photodetector 100 may be designed such that only the charge carriers with the higher mobility will have to travel across the drift layer 104. The principle is illustrated with an embodiment for a semiconductor material in which the electrons have a higher mobility than the holes, such as GaAs and $Al_xGa_{1-x}As$ (x=0 . . . 1) compounds. In the present embodiment, only the electrons (the carriers with higher mobility) will have to travel across the drift layer 104, while the holes (the carriers with lower mobility) will only have to travel over a distance that is less or at most equal to the thickness of the light absorption layer 102 before reaching the current spreading layer 110.

In the photodetector 100, the light absorption layer 102 comprises a semiconductor material of an intrinsic type and having a band gap energy 206 that allows the generation of electron-hole pairs within the light absorption layer 102 by the absorption of photons having a wavelength within a range of interest. In the particular case when the range of interest is close to a wavelength of 850 nm, the light absorption layer 102 may be made of an intrinsic GaAs (i-GaAs) semiconductor material. The lower band gap energy of undoped GaAs with respect to other intrinsic semiconductor materials is suitable for light absorption at wavelengths of interest in optical communications. The vertical length (thickness) of the light absorption layer 102 may be customized depending on the specific characteristics desired for the photodetector 100. A suitable range for the thickness of the light absorption layer 102 is between approximately 0.1 μm to 2 μm. Due to its undoped state, the light absorption layer 102 is essentially in a depleted condition during operation of the photodetector 100 which helps that a high electric field profile (electric potential gradient) be established within the light absorption layer 102 as required. The high electric field allows reducing the transit times of the "free" carriers within the light absorption layer 102.

The drift layer 104 comprises a semiconductor material having a band gap energy 208 such that the drift layer 104 essentially functions as a carrier transport layer. As shown in FIG. 2, the band gap energy 208 of the drift layer 104 is larger than the band gap energy 206 of the light absorption layer 102. In particular, the band gap energy 208 is sufficiently large such as to prevent, or at least substantially reduce, the absorption of light by the drift layer 104 at the optical wavelengths within the range of interest. In the illustrated embodiment, the drift layer 104 comprises an intrinsic or lightly n-type doped AlGaAs ($Al_xGa_{1-x}As$, x=0 . . . 1) compound semiconductor alloy. A vertical thickness of up to 5 μm may be used for the drift layer 104. The particular thickness to be used depends on the relative thicknesses of the other layers, in particular, the light absorption layer 102, and may be customized depending on the desired characteristics for photodetector 100.

The electric field in the drift layer 104 is lower than the electric field in the light absorption layer 102, as it will be explained later. The reduction of electric field in the drift layer 104 with respect to the light absorption layer 102 is depicted in FIG. 2 as a shift from a higher slope in the valence band edge 204 and the conduction band edge 202 for the light absorption layer 102 to a lower slope for the drift layer 104. This specific slope profile contrasts with the conventional constant slope exhibited across the whole structure of absorption and collecting layers in known PIN photodiode structures, such as the background art discussed above. In spite of the difference in the slopes of the valence and conduction band edges between the light absorption layer 102 and the drift layer 104 as depicted in FIG. 2, the band gap energies of the light absorption layer 102 and drift layer 104 remain essentially uniform along the thickness of the respective layers.

In the present embodiment, the transition from the higher electric field light absorption layer 102 to the lower electric field drift layer 104 is implemented by the grading layer 105. The grading layer 105 comprises a semiconductor material having a composition that gradually varies along its vertical thickness. Such gradual variation of semiconductor composition is accompanied by a corresponding gradual variation of the band gap energy. The semiconductor composition within the grading layer 105 is varied in such a manner that the band gap energy is substantially equal to the band gap energy 206 of the light absorption layer 102, at the side of the grading layer 105 directly adjacent to the light absorption layer 102, and gradually changes along the vertical thickness of the grading layer 105 towards a second band gap energy, at the side of the grading layer 105 directly adjacent to the drift layer 104, that is substantially equal to the band gap energy 208 of the drift layer 104. In the present embodiment, the composition of the semiconductor material is varied such as to obtain a gradual increase of the band gap energy along the grading layer 105 towards the drift layer 104 as shown in FIG. 2.

The reduction of electric field in the drift layer 104 with respect to the light absorption layer 102 is realized by the distribution of the dopant concentration in the light absorption layer 102, the drift layer 104 and the region between these two layers, which, in the illustrated embodiment, comprises the grading layer 105. In an exemplary embodiment, the electric field in the drift layer 104 is reduced by n-type doping a region of the grading layer 105 adjacent to the light absorption layer 102. This doped region may be substantially thinner than the grading layer 105 but may also be as thick as the grading layer 105. A thinner doped region will require higher doping levels, while a thicker region will require lower doping levels to achieve the desired reduction of the electric field in the drift layer 104. It is recognized that the main factor for achieving a particular reduction of the electric field in the drift layer 104 is the total fixed specific charge due to the n-type dopant introduced in a doped region directly adjacent to the light absorption layer 102.

In an alternative embodiment of the present invention, the reduction of the electric field in the drift layer 104 is achieved by n-type doping of a substantial portion of the drift layer 104 itself. It is recognized that also in this embodiment, the reduction of the electric field in the drift layer 104 is controlled by the total fixed charge due to the n-type dopant per unit area.

Other embodiments may combine doping of a portion of the grading layer 105 and doping of a portion, or of the entire drift layer 104. In either case, the concentration of n-type dopant that produces the desired reduction of electric field within the drift layer 104 is distributed over layers that participate in the carrier transport but which essentially do not absorb light in the range of interest, i.e. the grading layer 105 and the drift layer 104. Yet other embodiments may use a variable doping level distributed along the drift layer 104, or one or several very narrow regions with a substantially high doping level placed at particular locations in the region comprising layers 105 and 104, and/or in a region of the layer 102 adjacent to layer 104. The distribution of dopant concentration described above may be achieved by using doping techniques well known in the art, and which, therefore, will not be described here.

It is also recognized that, in general, charge carriers have higher mobility in intrinsic semiconductor materials and that the mobility decreases with the increase of doping concentration in the material. Hence, an intrinsic or a slightly doped drift layer 104 may be employed, while the reduction of the electric field in the drift layer 104 is achieved mainly by doping only a small portion of the grading layer 105 such that the impact of the reduced mobility (caused by doping) on the transit time of the carriers will not be significant.

In the illustrated embodiment, where the light absorption layer 102 comprises an intrinsic GaAs semiconductor material and the drift layer 104 comprises an intrinsic or lightly n-doped AlGaAs compound, the grading layer 105 comprises a lightly n-doped $Al_xGa_{1-x}As$ compound with a graded concentration x of aluminium. The parameter x may then adopt a value of substantially zero (GaAs), at the side directly adjacent to the light absorption layer 102, and increase gradually across the grading layer 105 until reaching, at the side directly adjacent to the drift layer 104, a value similar to the x concentration of the $Al_xGa_{1-x}As$ compound used for the drift layer 104. The graded band gap energy creates a pseudo-field within the grading layer 105 that essentially actuates on the minority carriers, i.e. on hole carriers in the case of a n-doped semiconductor layer. In the present embodiment, the grading layer 105 is a slightly doped, n-type semiconductor. Therefore, the created pseudo-field actuates essentially on hole carriers injected from the drift layer 104 by increasing their transport velocity.

Figure 2:
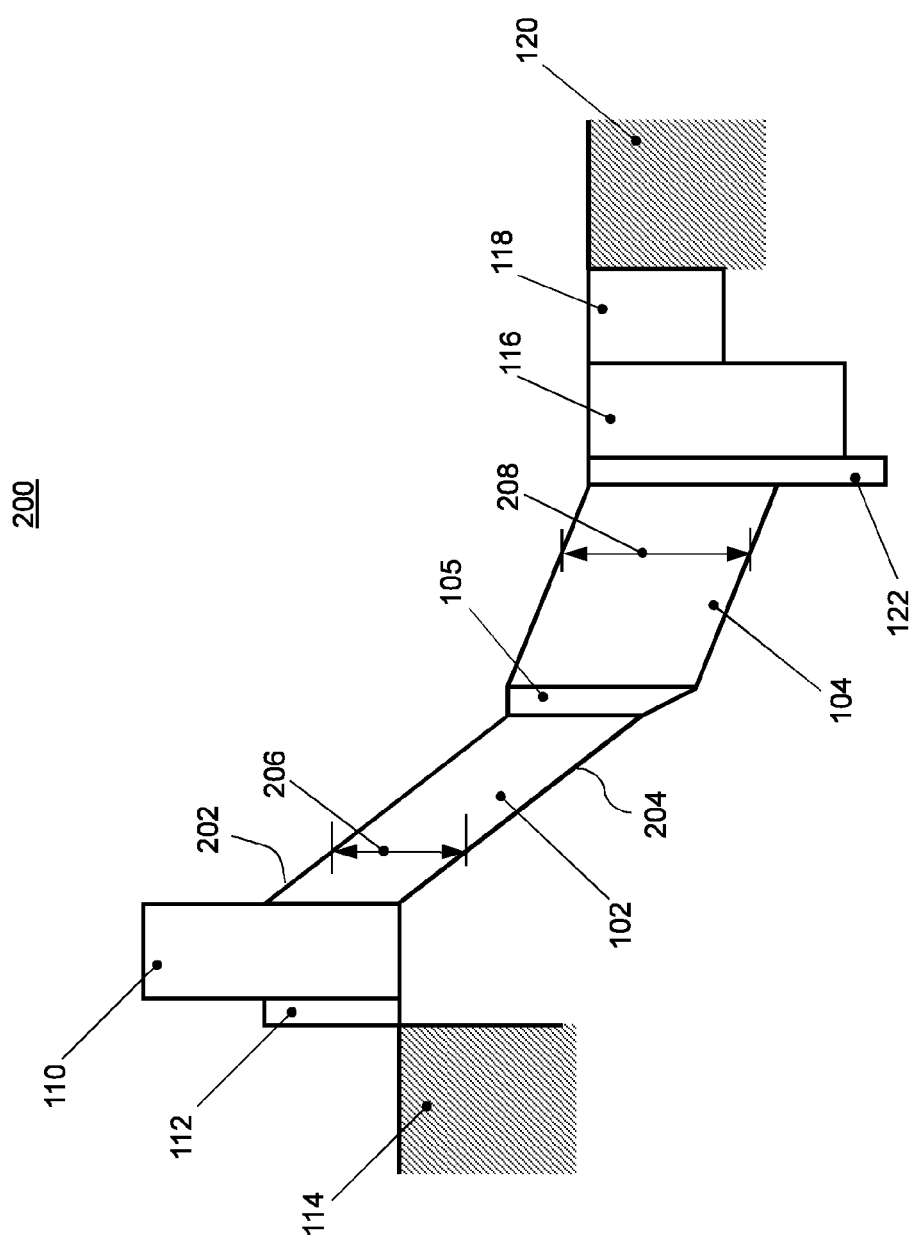
FIG. 2 is a band diagram of the photodetector of FIG. 1.

This effect is depicted in FIG. 2 by the increased slope of the valence band edge of the grading layer 105. The grading layer 105 also compensates for a mismatch between the valence band edges of the light absorption layer 102 and drift layer 104, which result from the difference of band gap energies between the light absorption layer 102 and the drift layer 104. Further, since the band gap energy of the grading layer 105 within a region close to the light absorption layer 102 is comparable to the band gap energy of the light absorption layer 102, incident photons may also be absorbed over a portion of the grading layer 105. In other embodiments, the grading layer 105 may exhibit a graded doping concentration in addition to and/or instead of the graded semiconductor composition. The graded doping concentration creates an additional field that actuates on both types of carriers, holes and electrons, and therefore, contributes for decreasing their respective transport times. Hence, by careful adjustment of the varying electrical field across the p-i-n junction, shorter transit times of both types of carriers can be achieved.

In another embodiment, the grading layer 105 may be implemented as a multi-layered structure of two or more layers of $Al_xGa_{1-x}As$ compounds, each layer having a concentration x that is gradually increased with respect to the concentration x in the preceding layer(s). In another embodiment, the band gap grading effect provided the grading layer 105 may be replaced by a region of graded composition that is integrated in either or both the light absorption layer 102 and the drift layer 104. In this configuration, the grading layer 105 is not physically present but rather comprised in the light absorption layer 102 and/or the drift layer 104 which are then directly interfaced by their corresponding adjacent sides. A gradient in material composition similar to the grading layer 105 described above can then be implemented within an end region of the light absorption layer 102 that interfaces with the drift layer 104, or vice-versa, such that a gradual transition from the material composition and/or doping of a substantial region of the light absorption layer 102 (or drift layer 104) towards the material composition and/or doping of a substantial region of the drift layer 104 (or light absorption layer 102) can be achieved.

As mentioned above, a p-side current spreading layer 110 is disposed between the light absorption layer 102 and the p-contact layer 112. The p-side current spreading layer 110 has the function of helping to extract the current of the photodetector 100 to the anode 114. Namely, in the case where the anode 114 is a ring contact, the p-side current spreading layer 110 helps to reduce the resistance of the photodetector 100. The p-side current spreading layer 110 comprises a semiconductor material having a band gap energy sufficiently higher than the band gap energy 206 of the light absorption layer 102 so as to confine light absorption to the directly adjacent light absorption layer 102. In this sense, the p-side current spreading layer 110 acts as a window layer as it allows the light incident on the top side of the photodetector 100 (i.e. the p-side in the illustrated embodiment) to pass through without attenuation. Further, the significantly higher band gap energy of the p-side current spreading layer 110 in comparison to the light absorption layer 102 also prevents the electron carriers generated in the light absorption layer 102 from flowing towards the anode 114. The p-side current spreading layer 110 also contributes to block the flow of electrons from the anode 114 into the light absorption layer 102, which would add a noise component to the optical response of the photodetector 100. The semiconductor material used for the p-side current spreading layer 110 may be a p-doped AlGaAs compound. The doping concentration of the p-side current spreading layer 110 is higher than the doping concentration of the light absorption layer 102 and significantly lower than the doping concentration of the p-contact layer 112. The p-contact layer 112 is a heavily doped p-type semiconductor, such as a p-doped GaAs compound.

As mentioned above, the photodetector 100 also comprises a current spreading layer 116 at the n-side of the photodetector 100. The n-side current spreading layer 116 provides functions similar to the p-side current spreading layer 110, although adapted to the characteristics of the n-doped side of the photodetector 100. In particular, the n-side current spreading layer 116 comprises an n-doped semiconductor material having a band gap energy higher than the band gap energy 208 of the drift layer 104, the grading layer 105 and the light absorption layer 102, such that it does not contribute to the absorption of incident light in the wavelength of interest and promotes the movement of the photo-generated hole carriers towards the anode 114. Further, the band gap energy of the n-side current spreading layer 116 is substantially higher than the band gap energy of the n-contact layer 118. As such, the flow of hole carriers from the n-contact layer 118 into the drift layer 104 is also blocked, thereby reducing a noise component in the response of the photodetector 100. The n-side current spreading layer 116 is provided as an n-doped AlGaAs compound layer. A suitable material for the n-contact layer 118 is an n-doped GaAs material.

The thicknesses of the current spreading layers is customized depending on the characteristics of the photodetector 100, such as the thicknesses of the other layers of the photodetector structure, and their specific doping concentration may be any commonly used in the art for providing the desired current spreading function. The thicknesses of the p-side current spreading layer 110 and/or the n-side current spreading layer 116 may be between substantially 1 and 2 µm. In other embodiments, the presence of current spreading layers at the p-side and/or at the n-side of the photodetector may be omitted. For instance, in embodiments where the photodetector has an n-contact layer that also serves as a substrate, the function of a current spreading layer at the n-side of the photodetector is not very important as the whole bottom of the photodetector is electrically conductive. In such a configuration, the n-side current spreading layer may be omitted.

An additional contribution for blocking the flow of hole carriers from the cathode side into the drift layer 104 and light absorption layer 102 may be provided by a thin semiconductor barrier layer 122 disposed between the drift layer 104 and the n-side current spreading layer 116. If hole carriers from the cathode side managed to enter into the drift layer 104, they would be swept out into the drift and absorption regions towards the anode 114, causing an additional noise component in the photodetector response. If such noise component is not critical, the barrier layer 122 may be omitted in the structure of the photodetector 100. The doping concentration and band gap energy for the barrier layer 122 are selected so as to provide the desired carrier barrier effect against the flow of minority carriers, i.e. carriers of polarity opposite to the polarity of the doping in the barrier layer 122 itself. The band gap energy of the barrier layer 122 may be larger than the band gap energy of the adjacent drift layer 104 as well as of the n-side current spreading layer 116. In the illustrated embodiment, the barrier layer 122 is made of an n-doped AlGaAs compound with a vertical thickness of substantially 20 nm. However, other semiconductor materials and/or doping concentration can be readily determined by those skilled in the art based on the specific parameters of the photodetector in order to achieve the desired blocking effect for the barrier layer. In other embodiments, the barrier layer 122 may also serve as an etch stop layer.

In other embodiments, the photodetector 100 may further comprise a barrier layer of a p-doped semiconductor disposed between the light absorption layer 102 and the p-side current spreading layer 110 so as to block the flow of electron carriers from the anode 114 into the light absorption layer 102. The p-doped and n-doped barrier layers may then be provided at both or only one of the p-side and n-side of the photodetector depending on the particular application.

Exemplary values of doping levels and thicknesses that may be used for forming a GaAs/AlGaAs based structure of the photodetector 100 as described above are summarized in Table 1. As generally used in the art, the notation $p^{++}$ refers to a heavily p-doped material, whereas the notation $p^+$ and $n^+$ refer to moderate levels of p-doping and n-doping, respectively.

TABLE 1

Doping level and thickness of the GaAs/AlGaAs layered structure of the photodetector 100.

| Capping and p-contact layer | $p^{++}$ - GaAs | ~20 nm |
|---|---|---|
| p-side current spreading layer (window layer) | $p^+$ - AlGaAs | ~1-5 µm |
| Light absorption layer | i - GaAs | ~0.1-2 µm |
| Grading layer GaAs → AlGaAs | n - AlGaAs | ~10-100 nm |
| Drift layer (non-absorbing) | n - AlGaAs | ~0.1-5 µm |
| Barrier for minority carriers (holes) (and etch-stop) | $n^+$ - AlGaAs | ~20 nm |

TABLE 1-continued

Doping level and thickness of the GaAs/AlGaAs layered structure of the photodetector 100.

| n-side current spreading layer | $n^+$ - AlGaAs | ~1-5 µm |
|---|---|---|
| n-contact layer | $n^+$ - GaAs | ~100 nm |
| Substrate | GaAs | |

Although not shown in FIGS. 1 and 2, the photodetector 100 may comprise additional functional layers for improving performance. For instance, lower-doping 'set-back' layers may be introduced next to the intrinsic semiconductor layers. Further, although the above embodiments were described with reference to a photodetector with an heterostructure of layers based on GaAs and AlGaAs materials, the present invention may also be implemented using other compound or elemental semiconductor materials instead of GaAs and AlGaAs, respectively, as long as the selected semiconductor materials have band gap energies and/or doping concentrations that follow the relative relation of band gap energies and/or doping concentrations described above.

Further, although the present invention has been described with reference to a vertically illuminated structure, the principles of the present invention may also be applied to a photodetector having a waveguide structure. As it will be also readily recognized by those skilled in the art, the term "vertically illuminated" and "vertical stacked structure" are not intended to limit the use or construction of the photodetector to a vertical orientation, and other orientations may be adopted, such as the detection of optical signals along an horizontal and/or a photodetector with an horizontal stacked structure. Further, the principles of the photodetector structure described above can be advantageously embedded in a Resonant Cavity Enhanced (RCE) style of the photodetector.

What is claimed is:

1. A photodetector, comprising:
a first layer comprising a first semiconductor material having a first band gap energy, a first electric field, and a first doping concentration, the first semiconductor material comprising a GaAs compound;
a second layer disposed on a side of the first layer opposite an incident light, the second layer comprising a second semiconductor material having a second band gap energy greater than the first band gap energy, a non-zero second electric field less than the first electric field, and a second doping concentration, the second layer interfaced with the first layer, the second semiconductor material comprising an AlGaAs compound; and
a region between the first and second layers having a third doping concentration.

2. The photodetector according to claim 1, wherein the second electric field is realized by at least one of the first doping concentration, the second doping concentration, and the third doping concentration.

3. The photodetector according to claim 2, wherein the first layer absorbs light of a wavelength within an intended range.

4. The photodetector according to claim 3, wherein at least a portion of the first layer is substantially in a depleted state.

5. The photodetector according to claim 3, wherein the second doping concentration is greater than the first doping concentration.

6. The photodetector according to claim 3, wherein the first doping concentration is variably distributed along the first layer, and the first doping concentration in a region of the first layer adjacent to the second layer is greater than the first doping concentration in the other regions of the first layer.

7. The photodetector according to claim 3, wherein the second doping concentration is variably distributed along the second layer, and the second doping concentration in a region of the second layer adjacent to the first layer is greater than the second doping concentration in the other regions of the second layer.

8. The photodetector according to claim 3, wherein the second semiconductor material is a lightly doped n-type semiconductor material.

9. The photodetector according to claim 3, wherein the first band gap energy and the second band gap energy are substantially uniform along a thickness of the first layer and the second layer.

10. The photodetector according to claim 3, wherein the region comprises a third layer comprising a third semiconductor material having a third band gap energy graded along a thickness of the third layer, the third layer interfacing the first layer with the second layer.

11. The photodetector according to claim 10, wherein the graded third band gap energy increases from a value substantially equal to the first band gap energy at a side of the third layer facing the first layer, to a value substantially equal to the second band gap energy at a side of the third layer facing the second layer.

12. The photodetector according to claim 11, wherein the third semiconductor material has a graded composition that gradually varies from a composition substantially equal to the first semiconductor material at the side of the third layer facing the first layer, to a composition substantially equal to the second semiconductor material at the side of the third layer facing the second layer.

13. The photodetector according to claim 11, wherein the third semiconductor material comprises a region doped with a dopant of a same type as the dopant of the second layer.

14. The photodetector according to claim 3, further comprising a first ohmic contact coupled to an external electrical circuit and a fourth layer disposed between the first ohmic contact and side of the first layer opposite to the second layer, the fourth layer comprising a fourth semiconductor material having a fourth band gap energy and a fourth doping concentration.

15. The photodetector according to claim 14, wherein the fourth doping concentration is greater than the first doping concentration.

16. The photodetector according to claim 15, wherein the fourth band gap energy is greater than the first band gap energy.

17. The photodetector according to 14, further comprising a second ohmic contact coupled to an external electrical circuit and a fifth layer disposed between the second ohmic contact and a side of the second layer opposite to the first layer, the fifth layer comprising a fifth semiconductor material having a fifth band gap energy greater than the second band gap energy, and a fifth doping concentration.

18. The photodetector according to claim 17, wherein at least one of the first and the second ohmic electrodes has a ring shape.

19. The photodetector according to claim 17, further comprising a barrier layer disposed between the second layer and the fifth layer, the barrier layer comprising a sixth semiconductor material having a sixth band gap energy and a sixth doping concentration, the sixth band gap energy is greater than the second band gap energy and the fifth band gap energy.

20. The photodetector according to claim 19, wherein the sixth semiconductor material comprises an n-doped AlGaAs compound and the barrier layer has a thickness of 20 nm.

21. The photodetector according to claim 1, wherein the first semiconductor material comprises an intrinsic GaAs compound, the second semiconductor material comprises an intrinsic or lightly n-doped AlGaAs compound, and the region is a third semiconductor material comprising a lightly n-doped AlGaAs compound with a graded concentration of aluminum, the concentration of aluminum having a value of substantially zero at a first side of the region adjacent the first layer and gradually increasing across the region toward an opposite second side of the region adjacent the second layer, the concentration of aluminum at the second side substantially similar to a concentration of aluminum of the AlGaAs compound of the second semiconductor material.

22. A photodetector, comprising:
a first layer comprising a first semiconductor material having a first band gap energy, a first electric field, and a first doping concentration, the first semiconductor material comprising a GaAs compound, the first layer absorbing light of a wavelength within an intended range;
a second layer comprising a second semiconductor material having a second band gap energy greater than the first band gap energy, a non-zero second electric field less than the first electric field, and a second doping concentration, the second layer interfaced with the first layer, the second semiconductor material comprising an AlGaAs compound;
a region between the first and second layers having a third doping concentration, the second electric field realized by at least one of the first doping concentration, the second doping concentration, and the third doping concentration;
a first ohmic contact coupled to an external circuit; and
a fourth layer disposed between the first ohmic contact and side of the first layer opposite to the second layer, the fourth layer comprising a fourth semiconductor material having a fourth band gap energy and a fourth doping concentration.

23. The photodetector according to claim 22, wherein the fourth doping concentration is greater than the first doping concentration.

24. The photodetector according to claim 23, wherein the fourth band gap energy is greater than the first band gap energy.

25. The photodetector according to 22, further comprising a second ohmic contact coupled to an external electrical circuit and a fifth layer disposed between the second ohmic contact and a side of the second layer opposite to the first layer, the fifth layer comprising a fifth semiconductor material having a fifth band gap energy greater than the second band gap energy, and a fifth doping concentration.

26. The photodetector according to claim 25, wherein at least one of the first and the second ohmic electrodes has a ring shape.

27. The photodetector according to claim 25, further comprising a barrier layer disposed between the second layer and the fifth layer, the barrier layer comprising a sixth semiconductor material having a sixth band gap energy and a sixth doping concentration, the sixth band gap energy is greater than the second band gap energy and the fifth band gap energy.

28. The photodetector according to claim 27, wherein the sixth semiconductor material comprises an n-doped AlGaAs compound and the barrier layer has a thickness of 20 nm.

29. A photodetector, comprising:
a first layer comprising a first semiconductor material having a first band gap energy, a first electric field, and a first doping concentration, the first semiconductor material comprising an intrinsic GaAs compound;
a second layer comprising a second semiconductor material having a second band gap energy greater than the first band gap energy, a non-zero second electric field less than the first electric field, and a second doping concentration, the second layer interfaced with the first layer, the second semiconductor material comprising an intrinsic or lightly n-doped AlGaAs compound; and
a region between the first and second layers comprising a third semiconductor material having a third doping concentration, the third semiconductor material comprising a lightly n-doped AlGaAs compound with a graded concentration of aluminum, the concentration of aluminum having a value of substantially zero at a first side of the region adjacent the first layer and gradually increasing across the region toward an opposite second side of the region adjacent the second layer, the concentration of aluminum at the second side substantially similar to a concentration of aluminum of the AlGaAs compound of the second semiconductor material.

* * * * *